(12) United States Patent
Nakamura et al.

(10) Patent No.: US 6,459,114 B1
(45) Date of Patent: Oct. 1, 2002

(54) NONVOLATILE SEMICONDUCTOR MEMORY

(75) Inventors: Hiroshi Nakamura, Fujisawa; Kenichi Imamiya, Tokyo, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/984,074

(22) Filed: Oct. 26, 2001

(30) Foreign Application Priority Data

Oct. 30, 2000 (JP) ........................................ 2000-330623

(51) Int. Cl.$^7$ ............................................. H01L 27/11
(52) U.S. Cl. ...................... 257/298; 257/288; 257/314; 257/315; 257/316; 257/321; 257/390; 438/265; 438/267; 438/257; 438/266; 438/593; 438/594; 365/185.22; 365/185.17; 365/185.19; 365/185.18; 365/185.03; 365/230.03
(58) Field of Search .................. 365/185.22, 185.17, 365/185.19, 185.29, 185.28, 185.01, 195, 225.7, 185.03, 200, 201, 226, 189.09, 230.03, 152.12, 185.21; 257/315–316, 314, 321, 390, 398; 345/87; 438/265–267, 257, 593–594, 596; 437/43

(56) References Cited

U.S. PATENT DOCUMENTS

| | | | | |
|---|---|---|---|---|
| 5,682,346 A | * | 10/1997 | Yamamura et al. | .... 365/185.18 |
| 5,889,699 A | * | 3/1999 | Takano | .................. 365/185.18 |
| 6,108,238 A | * | 8/2000 | Nakamura et al. | ...... 365/185.22 |
| 6,266,270 B1 | * | 7/2001 | Nobukata | .............. 365/185.03 |
| 6,370,081 B1 | * | 4/2002 | Sakui et al. | ............. 365/238.5 |
| 6,377,502 B1 | * | 4/2002 | Honda et al. | ........... 365/230.03 |
| 2002/0003723 A1 | * | 1/2002 | Tanzawa et al. | ........ 365/185.22 |

OTHER PUBLICATIONS

H. Onoda, et al., "A Novel Cell Structure Suitable for a 3 Volt Operation, Sector Erase Flash Memory", IEDM Tech. Digest, 1992, pp. 599–602.
H. Kume, et al., "A 1.28$\mu m^2$ Contactless Memory Cell Technology for a 3V–Only 64Mbit EEPROM", IEDM Tech. Digest, 1992, pp. 991–993.

* cited by examiner

Primary Examiner—Nathan J. Flynn
Assistant Examiner—Fazli Erdem
(74) Attorney, Agent, or Firm—Banner & Witcoff, Ltd.

(57) ABSTRACT

In an EEPROM consisting of a NAND cell in which a plurality of memory cells are connected in series, the control gate voltage $V_{read}$ of the memory cell in a block selected by the data read operation is made different from the each of the voltages $V_{sg1}$, $V_{sg2}$ of the select gate of the select transistor in the selected block so as to make it possible to achieve a high speed reading without bringing about the breakdown of the insulating film interposed between the select gate and the channel of the select transistor. The high speed reading can also be made possible in the DINOR cell, the AND cell, NOR cell and the NAND cell having a single memory cell connected thereto, if the control gate voltage of the memory cell is made different from the voltage of the select gate of the select transistor.

24 Claims, 12 Drawing Sheets

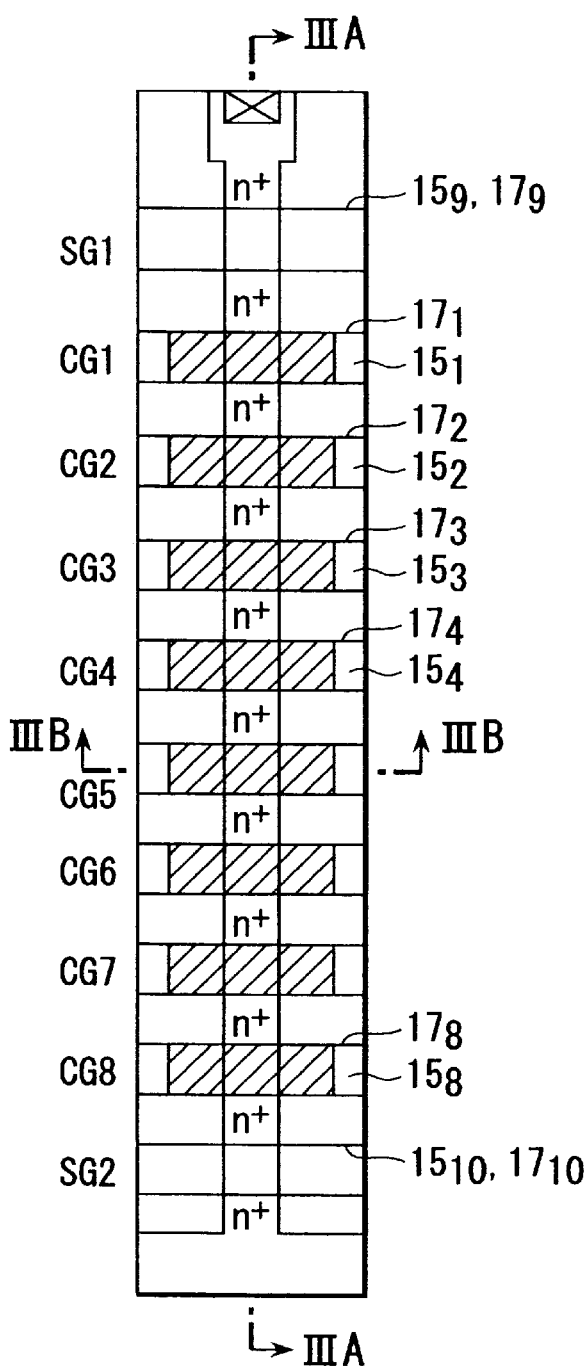
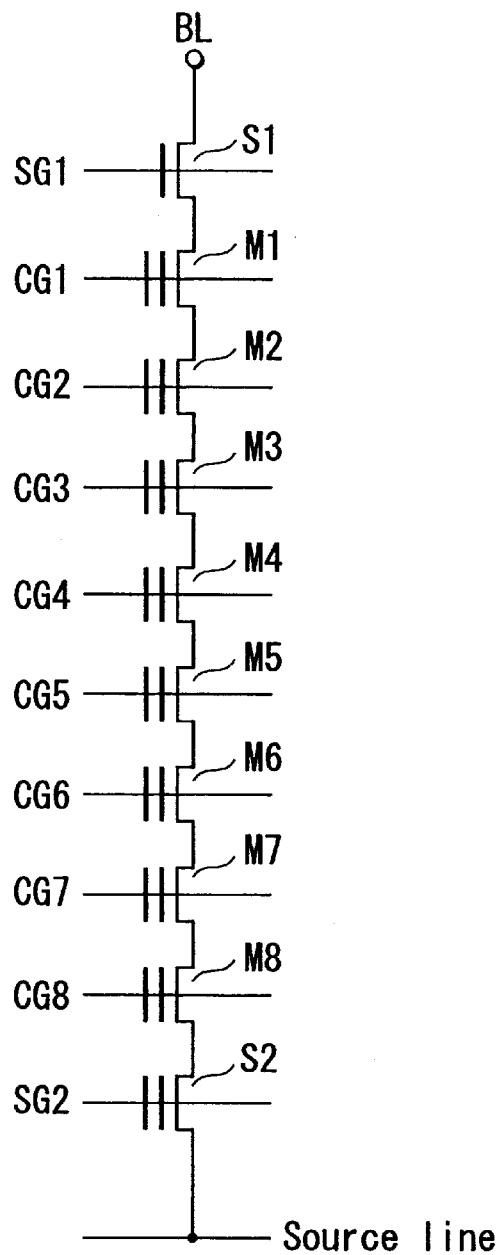
FIG. 2A
(RELATED ART)
FIG. 2B
(RELATED ART)

NONVOLATILE SEMICONDUCTOR MEMORY

CROSS-REFERENCE TO RELATED APPLICATIONS

This application is based upon and claims the benefit of priority from the prior Japanese Patent Application No. 2000-330623, filed Oct. 30, 2000, the entire contents of which are incorporated herein by reference.

BACKGROUND OF THE INVENTION

1. Field of the Invention

The present invention relates to a nonvolatile semiconductor memory device, particularly, to an electrically rewritable nonvolatile semiconductor memory device consisting of cell units such as a NAND cell, a NOR cell, a DINOR cell (Divided NOR cell) and an AND cell.

2. Description of the Related Art

The conventional semiconductor memory device includes an electrically rewritable EEPROM (Electrically Erasable Programmable Read Only Memory). Particularly, a NAND type EEPROM having a block construction consisting of NAND cells having a plurality of memory cells connected in series attracts attentions because it is possible to increase the degree of integration.

The memory cell of the NAND type EEPROM is formed of MOSFET's having a stacked gate structure including a floating gate acting as a charge storage layer and a control gate, which are stacked one upon the other on a semiconductor substrate with a gate insulating film interposed therebetween. The NAND cell is formed of adjacent memory cells connected in series with the source and drain used commonly.

In the NAND type EEPROM, these plural NAND cells are connected to a bit line with each NAND cell forming a unit and are arranged to form a matrix, thereby constructing a memory cell array. The memory cell array is formed in high density in a p-well on a semiconductor substrate or on a p-type semiconductor substrate.

The drains on one terminal section of the NAND cells arranged in the column direction of the memory cell array are connected to a common bit line through select transistors, and the other terminal section of the NAND cells are similarly connected to a common source line through select transistors. The control gate of the memory cell and the select gate of the select transistor are formed as a series of control gate lines (word lines) and select gate lines in the row direction of the memory cell array.

The conventional NAND type EEPROM is operated as follows.

Specifically, the data program operation is successively performed starting with the memory cell positioned remotest from the bit line contact of the NAND cell. The memory cell for programming the data is selected, and a high voltage Vpp (about 20V) for the data programming is applied to the control gate line to which is connected the selected memory cell. Also, an intermediate potential Vmw (about 10V) is applied to the control gate line of the memory cell positioned closer to the bit line than the selected memory cell and to the select gate line of the select transistor. Further, 0V or an intermediate potential Vmb (about 8V) is applied to the bit line of the selected memory cell in accordance with the level of the data.

If 0V is applied to the bit line, 0V is transmitted to the drain of the memory cell so as to bring about an electron injection from the drain into the floating gate, with the result that the threshold voltage of the selected memory cell is shifted in the positive direction. This is the "1" programmed state. Also, if the intermediate potential Vmb is imparted to the bit line, the electron injection into the floating gate does not take place, with the result that the threshold voltage of the selected memory cell is not changed so as to remain in the negative value. This is the "0" programmed state.

The data erase operation is performed simultaneously in respect of all the memory cells within the block consisting of the selected NAND cells. All the control gate lines within the selected block are set at 0V, and voltage of about 20V is applied as Vpp to the p-well (or p-type substrate) so as to put the bit line, the source line, the control gate line and the select gate line in the unselected block in the floating state. In this fashion, the electrons in the floating gates included in all the memory cells within the selected block are discharged into the p-well (or a p-type substrate) so as to shift the threshold voltage of the memory cell in the negative direction.

The data read operation is performed by detecting whether or not an electric current flows from the bit line into the source line through the selected memory cell and a plurality of unselected memory cell, with the unselected control gate line in the selected block set at $V_{read}$, with the selected control gate line set at 0V, and with the select gate line also set at $V_{read}$.

As described above, in the NAND type EEPROM, each of the unselected control gate line and the select gate line in the selected block is set at $V_{read}$ during the data read operation. In this case, a serious problem is generated as described below.

In order to increase the reading speed, it is necessary to increase the current flowing through the NAND cell including the selected memory cell having the "0" data programmed therein. For example, where a single NAND cell is formed of 8 memory cells, it is possible to increase the current flowing through the NAND cell by lowering the resistance of the unselected 7 memory cells.

In order to lower the resistance of the unselected 7 memory cells, it is highly effective to enhance the level of $V_{read}$ applied to the control gates of these 7 memory cells during the read operation. In this case, $V_{read}$ is also applied simultaneously to the select gate of the select transistor.

The memory cell includes two insulating films formed between the control gate and the channel of the memory cell, i.e., an insulating film formed between the control gate and the floating gate, and another insulating film formed between the floating gate and the channel. It follows that, even if the level of $V_{read}$ is enhanced, the intensity of the electric field applied to the insulating film positioned between the floating gate and the channel is lowered.

In the select transistor, however, the select gate of the select transistor and the floating gate of the memory cell are formed of the same wiring layer and, thus, only one insulating film is formed between the select gate of the select transistor and the channel. It follows that the intensity of the electric field applied to the insulating film is increased, with the result that breakdown of the insulating film tends to be brought about.

BRIEF SUMMARY OF THE INVENTION

The present invention provides a nonvolatile semiconductor memory device. In the nonvolatile semiconductor memory device according to an embodiment of the present invention, the voltage of the control gate of the memory cell included in the block selected in the data read operation is made different from the voltage of the select gate of the select transistor included in the selected block so as to make it possible to read out at a high speed the program data in the memory cell without bringing about breakdown of the insulating film formed between the select gate of the select transistor and the channel. Similarly, a high speed reading can be made possible in respect of a DINOR cell, an AND cell, a NOR cell and a NAND cell having a single memory cell connected thereto.

According to a first aspect of the present invention, there is provided a nonvolatile semiconductor memory device, comprising a memory cell array including memory cell units each comprising at least one select transistor and at least one memory cell and arranged to form an array; a control gate line including control gates of memory cells connected continuously in a row direction of the memory cell array; and a select gate line including select gates of select transistors connected continuously in the row direction of the memory cell array; wherein the highest value of a first voltage level of the control gate line in a selected memory cell unit differs from a second voltage level of all the select gate lines of the memory cell unit during a read operation of a program data programmed in the memory cell and during a verify read operation of the program data.

According to a second aspect of the present invention, there is provided a nonvolatile semiconductor memory device, comprising a memory cell array including memory cell units each comprising first and second select transistors and at least one memory cell and arranged to form an array; a control gate line including control gates of memory cells connected continuously in a row direction of the memory cell array; a first select gate line including select gates of the first select transistors connected continuously in the row direction of the memory cell array, and a second select gate line including select gates of the second select transistors connected continuously in the row direction of the memory cell array; wherein a first voltage level of the first select gate line in the selected memory cell unit differs from a second voltage level of the second select gate line in the memory cell units during a read operation of a program data programmed in the memory cell and during a verify read operation of the program data.

BRIEF DESCRIPTION OF THE SEVERAL VIEWS OF THE DRAWING

FIG. 2A shows the cell construction of the NAND type EEPROM;

FIG. 2B shows the equivalent circuit of the cell of the NAND type EEPROM;

DETAILED DESCRIPTION OF THE INVENTION

Some embodiments of the present invention will now be described with reference to the accompanying drawings.

Figure 1:
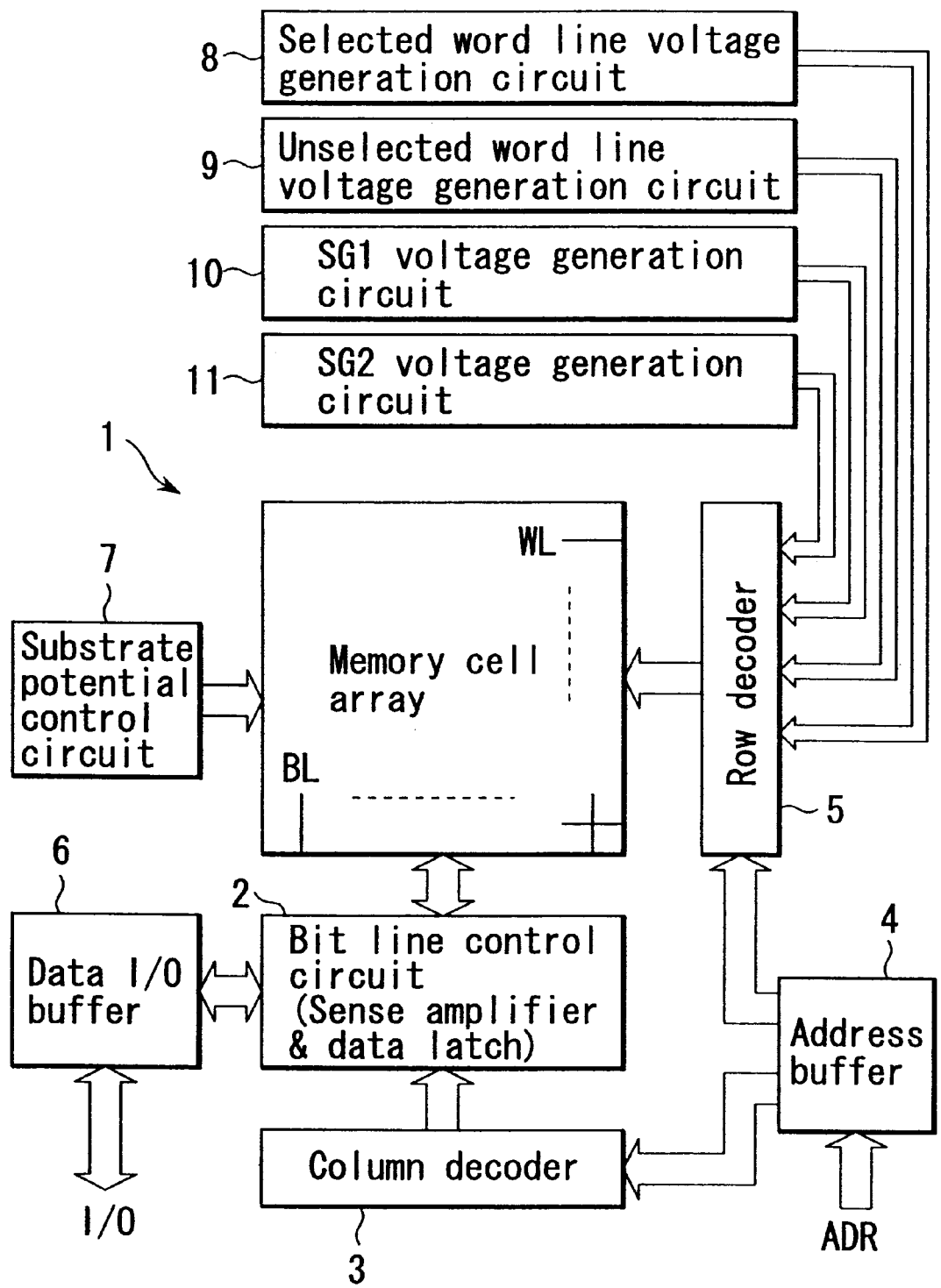
FIG. 1 is a block diagram showing the construction of the NAND type EEPROM according to a first embodiment of the present invention.

FIG. 1 is a block diagram showing the construction of a nonvolatile semiconductor memory device according to a first embodiment of the present invention.

The main portion of the nonvolatile semiconductor memory device shown in FIG. 1 comprises a memory cell array 1 having a word line WL arranged in the row direction and a bit line BL arranged in the column direction, a bit line control circuit 2 that also plays the roles of a sense amplifier and a data latch, a column decoder 3, an address buffer 4 having an address ADR inputted therein from the outside, a row decoder 5, a data I/O buffer 6 having I/O data exchanged with an external I/O, and a substrate potential control circuit 7.

The nonvolatile semiconductor memory device shown in FIG. 1 also comprises a selected word line voltage generation circuit 8 used for the program and read operations of the memory cell array 1, an unselected word line voltage generation circuit 9, a voltage generation circuit 10 for the select gate line SG1, and a voltage generation circuit 11 for the select gate line SG2. These circuits serve to output the voltage of each level relating to the reading operation of the nonvolatile semiconductor memory device of the present invention.

The column decoder 3 receives a column address from the address buffer 4 and selects the bit line control circuit 2 arranged for each column. The bit line control circuit 2 is connected to the data I/O buffer 6 and exchanges I/O data with the selected memory cell via the bit line.

The row decoder 5 controls the control gate line and the select gate line of the memory cell array 1. Also, the substrate potential control circuit (well potential control circuit) 7 controls the potential of the p-type substrate or the p-type well in which is formed the memory cell array 1.

In reading data, the select word line voltage output circuit 8 generates the voltage applied to the selected word line in the selected block, and the unselected word line voltage generation circuit 9 generates the voltage applied to the unselected word line in the selected block. Also, the SG1 voltage generation circuit 10 and the SG2 voltage generation circuit 11 are circuits for generating the voltages applied to the select gate line SG1 on the side of the bit line and to the select gate line SG2 on the side of the source line, respectively.

The bit line control circuit 2 is formed mainly of a flip-flop and performs the sense operation for reading the latched program data and the bit line potential, and the sense operation for the verify read after the programming or the latch of the reprogrammed data.

FIGS. 2A and 2B are a plan view and an equivalent circuit diagram, respectively, of a single NAND cell included in the memory cell array 1. In the example shown in the drawings, 8 memory cells M1 to M8 are connected in series with the adjacent memory cells sharing the $n^+$ source/drain diffusion layer so as to form a single NAND cell. The NAND cell comprises a select transistor $S_1$ on the side of the BL line and a select transistor $S_2$ on the side of the source line. The select gates of these select transistors $S_1$ and $S_2$ are connected to the select gate lines SG1 and SG2, respectively.

Reference numerals $15_1$ to $15_8$ denote the plan views of the floating gates (hatched regions shown in FIG. 2A) of the memory cells, and reference numerals $17_1$ to $17_8$ are plan views of the control gates of the memory cells. The select gates of the select transistors S1 and S2 are formed on the same wiring layer together with the floating gates and the control gates of the memory cells and are denoted by reference numerals $15_9$, $17_9$ and $15_{10}$, $17_{10}$ in the plan view shown in FIG. 2A.

Figure 3A:
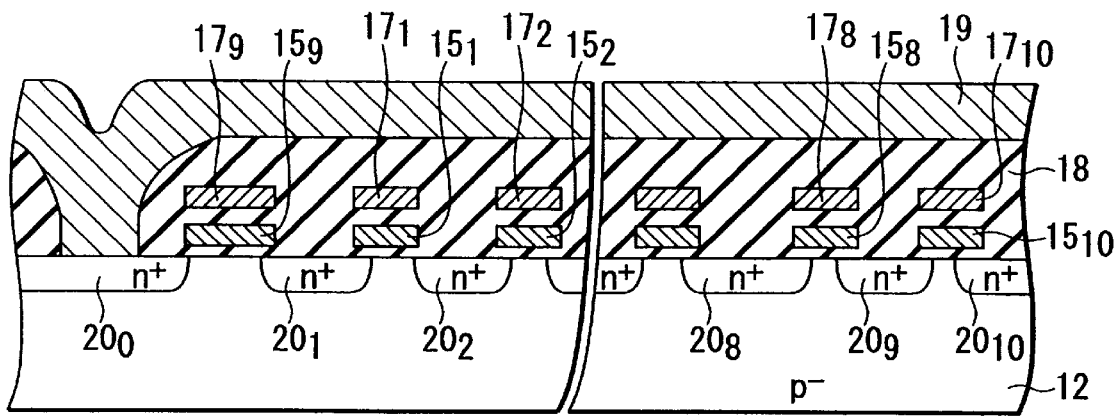
FIG. 3A is a cross sectional view along the line IIIA—IIIA shown in FIG. 2A and shows the construction of the cell of the NAND type EEPROM.
Figure 3B:
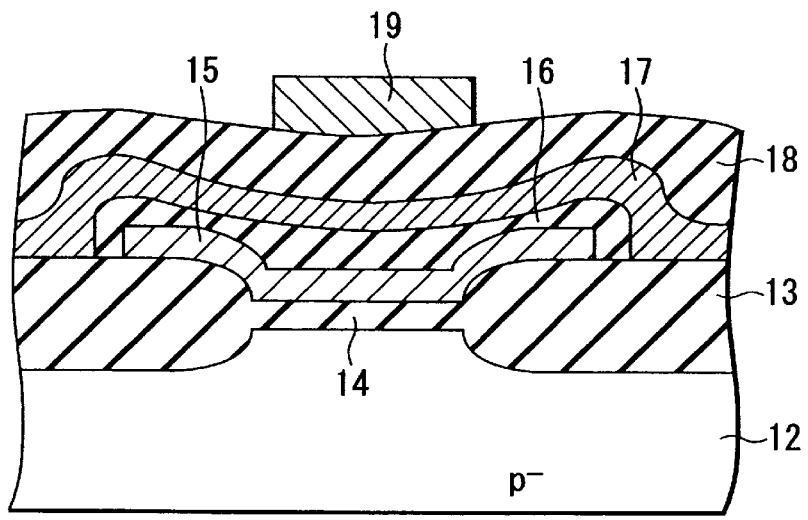
FIG. 3B is a cross sectional view along the line IIIB—IIIB shown in FIG. 2A and shows the construction of the cell of the NAND type EEPROM.

FIGS. 3A and 3B are cross sectional views along the line IIIA—IIIA and the line IIIB—IIIB shown in FIG. 2, respectively. As shown in the drawings, a floating gate 15 ($15_1$ to $15_8$) of the memory cells is formed on a $p^-$ substrate 12 with a gate insulating film 14 interposed therebetween, and a control gate 17 ($17_1$ to $17_8$) of the memory cell is formed on the floating gate 15 with an interlayer insulating film 16 interposed therebetween. These memory cells are connected in series with the adjacent memory cells sharing the an $n^+$ diffusion layer 20 ($20_1$ to $20_8$) forming the source/drain of the memory cell. It should be noted that the floating gate 15 and the control gate 17 of the memory cell are insulated from each other by the insulating film 16 so as to be applied in general at different potentials.

As described previously, the select gates $15_9$, $17_9$ and the select gates $15_{10}$, $17_{10}$ formed simultaneously with the floating gate 15 and the control gate 17 of each memory cell are formed on the sides of the drain and the source, respectively, of the NAND cell. The surface of the $p^-$ substrate 12 having these elements formed thereon is covered with a CVD oxide film 18, and a bit line 19 is formed on the CVD oxide film 18.

The bit line 19 is connected to the diffusion layer $20_0$ on the side of the drain constituting one terminal section of the NAND cell. The control gates 17 of the memory cells form continuous control gate lines CG1 to CG8 arranged in the row direction of the memory cell array. These control gate lines CG1 to CG8 collectively form a word line WL of the memory cell array. The select gates $15_9$, $17_9$ and the select gates $15_{10}$, $17_{10}$ are also arranged in the row direction of the memory cell array so as to form continuous select gate lines SG1, SG2.

The select gates $15_9$, $17_9$ and the select gates $15_{10}$, $17_{10}$ are electrically connected to each other in general in regions not shown, and each of the select gates $15_9$, $17_9$ and the select gates $15_{10}$, $17_{10}$ has the same voltage level. It follows that, in the select transistors S1 and S2, only the select gates $15_9$ and $15_{10}$ substantially play the role of the select gate.

Since the gate insulating films of the memory cell and the select transistor are generally formed simultaneously in the same process, e.g., in the thermal oxide formation process, the thickness of the insulating film formed between the channel and the floating gate of the memory cell, i.e., the insulating film 14 shown in FIG. 3B, is equal to the thickness of the insulating film formed between the channel of the select transistor and the select gate of the select transistor.

Since the memory cell section and the select transistor section are formed simultaneously, it is unnecessary to make the memory cell region, e.g., the lower region of the control gate $17_1$, different from the select transistor region, e.g., the lower region of the select gate $17_9$, in the implanting conditions of the impurity ions and the process conditions. As a result, it is possible to markedly decrease the distance between the control gate $17_1$ and the select gate $17_9$ so as to diminish the cell size of the NAND cell. In general, the select transistors S1 and S2 are formed simultaneously and, thus, the setting in the thickness of the gate insulating film and the implantation of the impurity ions are carried out simultaneously under the same process conditions in respect of the select transistors S1 and S2, too.

Figure 4:
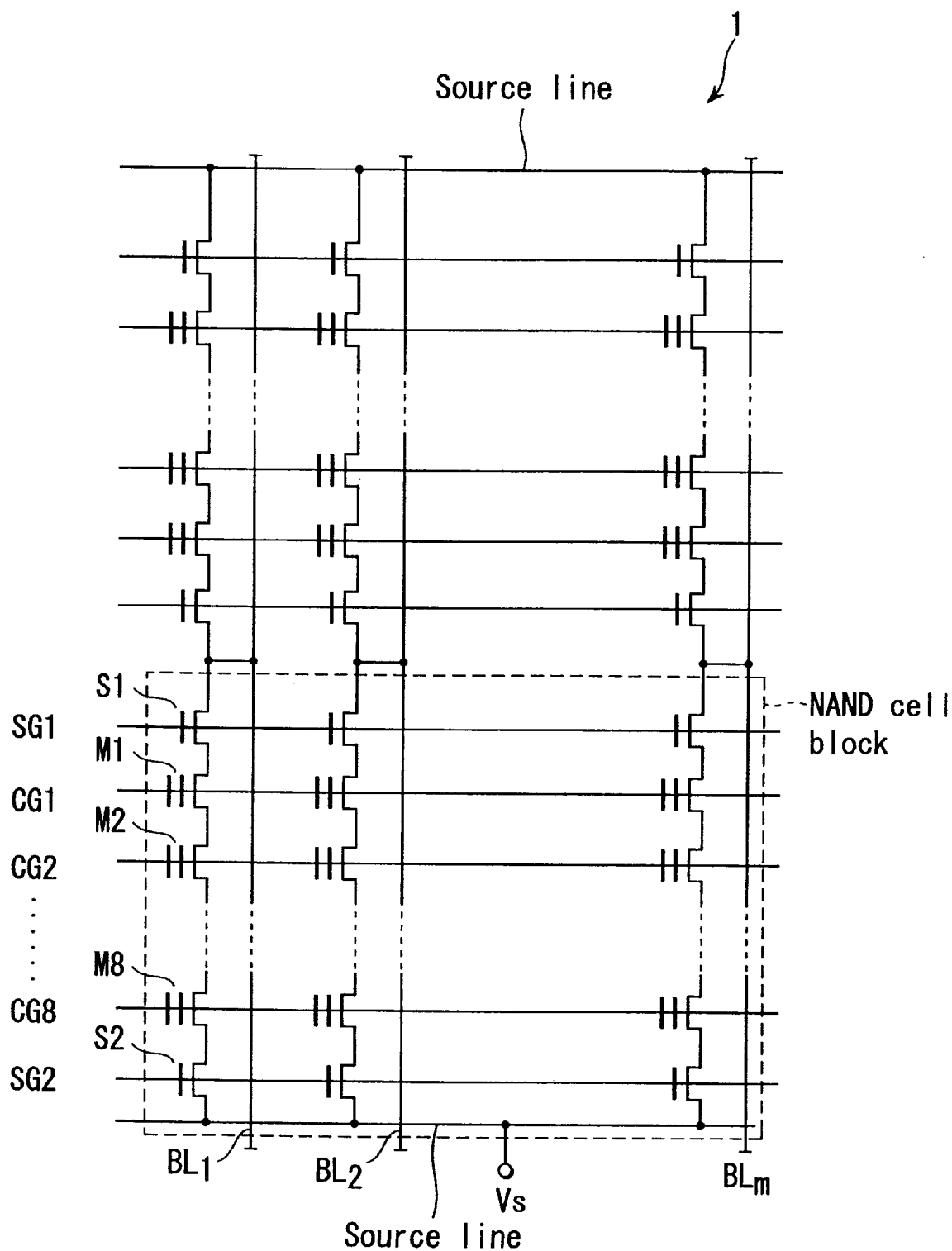
FIG. 4 is an equivalent circuit diagram of the NAND type memory cell array.

FIG. 4 is an equivalent circuit diagram of the memory cell array 1 in which NAND cells are arranged to form a matrix. In FIG. 4, $V_s$ represents the voltage of the source line. As shown in the drawing, an m-number of bit lines $BL_1$ to $BL_m$ are arranged in the column direction of the memory cell array 1. The NAND cell group sharing the same word lines (control gate lines CG1 to CG8) and the select gate lines SG1, SG2 is called a block, and the region surrounded by a broken line corresponds to a single block. The operation for the reading, programming, etc. is performed by selecting a single block from among a plurality of blocks.

<First Embodiment>

Figure 5:
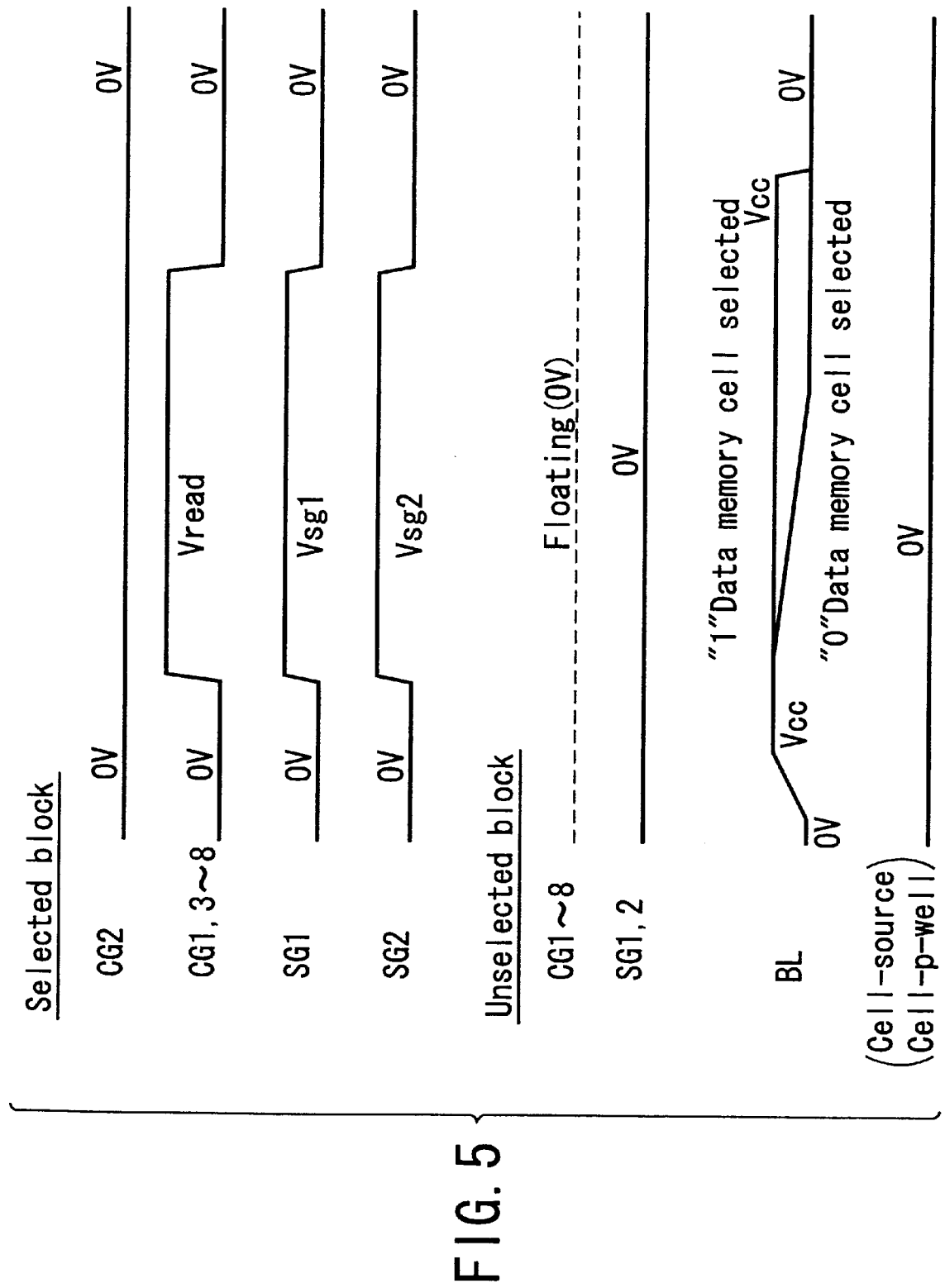
FIG. 5 is a timing wave form diagram showing the read operation of the nonvolatile semiconductor memory device according to the first embodiment of the present invention.

A first embodiment of the present invention will now be described with reference to FIG. 5. Specifically, FIG. 5 is a timing wave form diagram showing the data read operation performed by the nonvolatile semiconductor memory device according to the first embodiment of the present invention. The timing wave form diagram shown in FIG. 5 is directed to the read operation, covering the case where, for example, the control gate line CG2 is selected from among 8 control gate lines CG1 to CG8 of the NAND cell. Needless to say, the same read operation is performed in the case where any of the other 7 control gate lines is selected.

In the timing wave form diagram shown in FIG. 5, the upper four stages show the voltage wave forms of the control gate line CG2 of the selected memory cell within the selected block, the control gate lines CG1, and CG3 to CG8 of the unselected memory cell, and the select gate lines SG1, SG2 on the sides of the bit line and source line. For the read operation, the control gate line CG2 of the selected memory cell is fixed at 0V, and the read voltage $V_{read}$ is inputted to the control gates lines CG1, and CG3 to CG8 of the unselected memory cell. Also, select gate voltages $V_{sg1}$, $V_{sg2}$ are inputted to the select gate lines SG1, SG2.

Also, the central two stages of FIG. 5 show the state of the control gate lines CG1 to CG8 among the unselected block and the voltage of the select gate lines SG1, SG2. Within the unselected block, the control gate lines CG1 to CG8 are fixed at a floating state in which voltage is not applied or at 0V. Incidentally, the select gate lines SG1, SG2 are also fixed at 0V so as to inhibit the read operation.

Further, the lower two stages of FIG. 5 show the changes in the voltage of a pair of the selected bit lines BL and the voltages of the cell-source or the cell-p-well. During the read operation, the selected bit line BL is pre-charged from 0V to Vcc so as to detect the change in the bit line voltage caused by the discharge current flowing from the drain side toward the source side of the selected NAND cell via the selected bit line BL.

If "1" data is programmed in the selected memory cell, the threshold voltage of the selected memory cell is positive.

Also, since the voltage of the Cell-source or the cell-p-well is fixed at 0V, the pre-charge voltage Vcc pre-charged to the bit line BL is maintained, if CG2 of the selected memory cell is 0V.

If "0" data is programmed in the selected memory cell, the threshold voltage of the selected memory cell is negative. Also, since the voltage of the cell-source or the cell-p-well is fixed at 0V, the pre-charge voltage Vcc pre-charged to the bit line BL is discharged through the selected NAND cell so as to be brought back to 0V, if CG2 of the selected memory cell is 0V.

The read operation according to the first embodiment of the present invention shown in FIG. 5 is featured in that, in the data read operation described above, the read voltage $V_{read}$ of the unselected control gate lines CG1 and CG3 to CG8 in the selected block differs from the voltage of the selected gate lines SG1, SG2. In other words, the read operation noted above is featured in that the read operation is performed under the state of $V_{read} \neq V_{sg1}$, $V_{read} \neq V_{sg2}$. FIG. 5 exemplifies the state of $V_{read} > V_{sg1}$, $V_{read} > V_{sg2}$.

The effect of the read operation using the timing wave form shown in FIG. 5 will now be described.

As described previously, in order to realize a high speed reading operation, it is necessary to increase the read current flowing through the selected NAND cell including the selected memory cell having "0" data programmed therein.

If a single NAND cell is formed of 8 memory cells, it is possible to increase the read current flowing through the NAND cell by lowering the resistance of the unselected 7 memory cells. The resistance of the unselected 7 memory cells can be lowered by increasing the voltage level of $V_{read}$ inputted to the control gates of these 7 memory cells.

Figure 6:
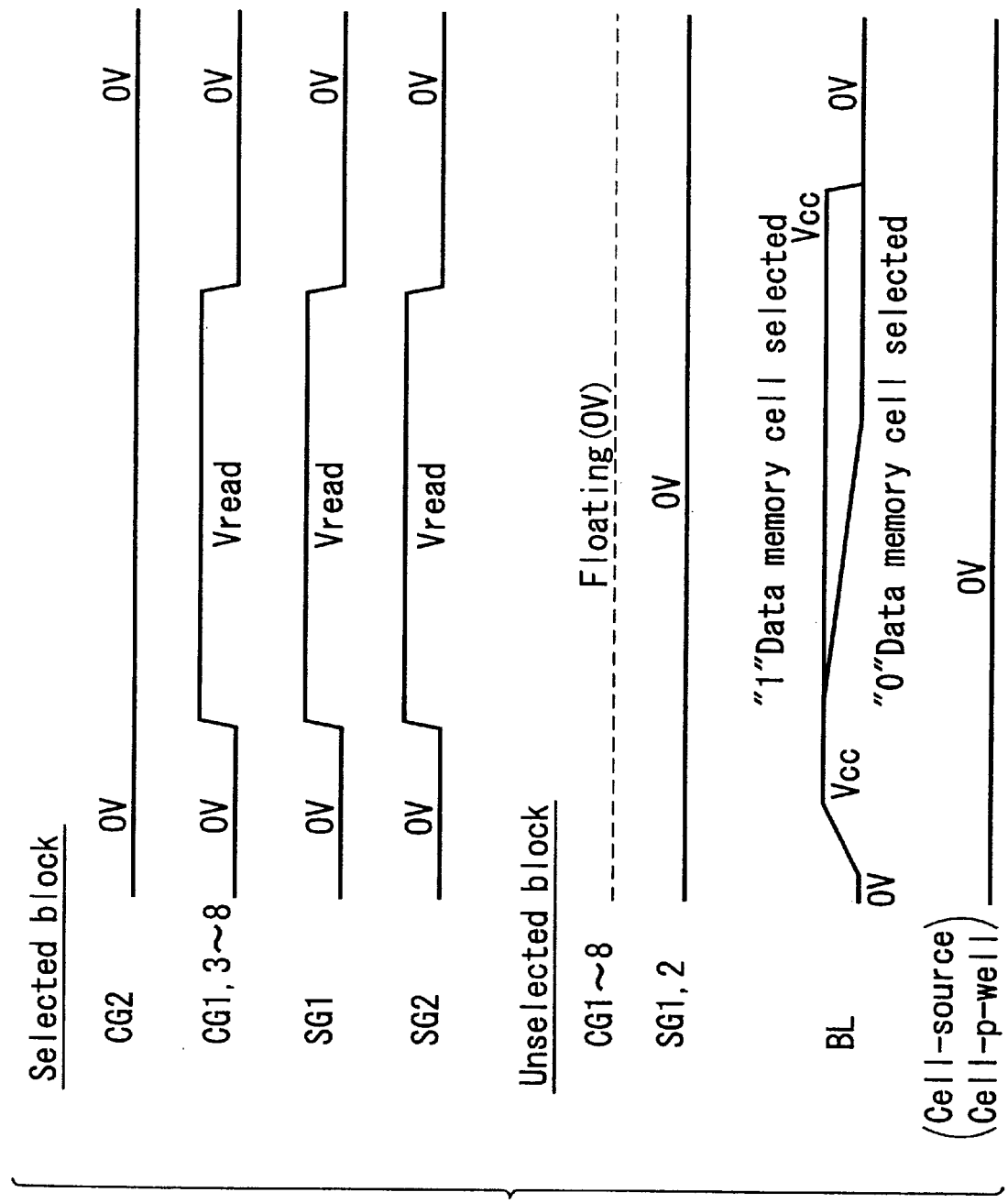
FIG. 6 is a timing wave form diagram showing the conventional read operation.

FIG. 6 shows the conventional timing wave form of the read operation for comparison with the timing wave form of the read operation in the first embodiment of the present invention. In the conventional read operation, the unselected control gate lines CG1 and CG3 to CG8 and the selected gate lines SG1, SG2 have the same voltage level $V_{read}$ and, thus, the voltage of the same level is applied to the control gates of the memory cells and to the select gates of the select transistors.

As described previously, two insulating films are formed between the control gate and the channel of the memory cell, i.e., an insulating gate formed between the control gate and the floating gate and another insulating gate formed between the floating gate and the channel. In addition, the control gate is insulated from the floating gate. As a result, the voltage is divided into the two insulating films even if the voltage level of the read voltage $V_{read}$ is increased, with the result that the voltage applied to the insulating film formed between the floating gate and the channel is lowered.

On the other hand, in the select transistor, the select gate voltage is substantially applied in general to the gate electrode of the wiring layer (see $15_9$, $15_{10}$ in FIG. 3A and the related description) forming the floating gate of the memory cell. Also, only one insulating film is formed between the gate electrode and the channel. It follows that the select gate voltage is not dispersed ($V_{sg1} = V_{sg2} = V_{read}$), with the result that the electric field intensity within the film is increased so as to bring about the possibility that the insulating film is broken down.

In the conventional method of avoiding the breakdown of the insulating film, the insulating film formed between the select gate and the channel of the select transistor is made thicker than the insulating film formed between the floating gate and the channel of the memory cell (see 14 in FIG. 3B). In this case, however, it is necessary to make the memory cell region (lower region of the select gate $17_1$ shown in FIG. 2A) different from the select transistor (lower region of the select gate $17_9$ in FIG. 2A) in the process condition so as to increase the distance between the control gate $17_1$ and the select gate $17_9$. It follows that a problem is generated that it is difficult to reduce the cell size of the NAND cell.

Since it is possible to increase the voltage level (voltage level of $V_{read}$) of the unselected control gate line in the selected block so as to make the voltage level (voltage level of $V_{sg1}$, $V_{sg2}$) of the select gate unchanged by using the read operation according to the first embodiment of the present invention shown in FIG. 5, it is possible to markedly lower the resistance of the unselected memory cell in the selected block. It follows that it is possible to increase the read current flowing through the selected NAND cell including the selected "0" data programmed memory cell, thereby avoiding the breakdown of the insulating film of the selected transistor without increasing the cell size of the NAND cell.

As described above, only one insulating film is formed between the select gate line and the channel of the select transistor, though two insulating films are formed between the memory cell and the channel of the control gate line. Therefore, it is possible to set the highest value of the voltage applied to the control gate line at a level higher than the highest value of the voltage applied to the select gate line (see $V_{read}$ shown in FIG. 5). In other words, it is possible to prevent an increase of the voltage between the select gate of the select transistor and the channel by setting the condition of $V_{read} > V_{sg1}$, $V_{read} > V_{sg2}$, so as to improve the operating speed and the reliability of the nonvolatile semiconductor memory device.

In the embodiment described above, the voltages SG1 and SG2 of the select gate line during the reading operation differ from each other in the voltage level. However, the similar effect can be obtained even where the voltage SG1 and SG2 are equal to each other in the voltage level. Where $V_{sg1}$ is equal to $V_{sg2}$ ($V_{sg1} = V_{sg2}$), a single kind of voltage is charged in the select gate and, thus, is advantageous in that it is possible to decrease the number of circuits and the circuit area, compared with the case where $V_{sg1}$ is not equal to $V_{sg2}$ ($V_{sg1} \neq V_{sg2}$). Also, in the first embodiment described above, the voltage of the selected control gate line CG2 is set at 0V during the data read operation. However, the similar effect can also be obtained in the case where the voltage of the control gate line CG2 is positive or negative.

<Second Embodiment>

The read operation according to a second embodiment of the present invention will now be described as a modification of the first embodiment. The second embodiment is directed to a modification of the first embodiment modified such that, in the read operation in the first embodiment, the voltage $V_{sg1}$ of the select gate line SG1 on the side of the bit line is set higher than the voltage $V_{sg2}$ of the select gate line SG2 on the side of the source line as described in the following.

In the read operation of the selected NAND cell, it is unavoidable for a series resistance to remain in the unselected memory cells constituting the selected NAND cell or in the selected memory cell having "0" data programmed therein. Therefore, if an electric current for the reading flows through the selected NAND cell, a potential difference is generated between the bit line contact and the source line.

For example, suppose that, when a positive voltage is applied to the bit line BL so as to cause the read current to flow through the selected NAND cell, the source voltage of the select transistor S1 on the side of the bit line BL is increased to 1V by the series resistance noted above. In this case, if the voltage $V_{sg2}$ of the select gate line SG2 required for turning on the select transistor S2 on the side of the source line is, for example, 3V, it is necessary to set the voltage $V_{sg1}$ of the select gate line SG1 required for turning on the select transistor S1 on the side of the bit line, which is equal in construction to the select transistor S2 on the side of the source line, at 4V.

As described above, it is desirable to set the condition $V_{sg1} > V_{sg2}$ in order to increase the speed of the read operation. If this condition is combined with the first embodiment, it is apparently desirable for $V_{sg1}$, $V_{sg2}$, and the voltage $V_{read}$ of the control gate lines CG1 and CG3 to CG8 of the unselected memory cells in the selected NAND cell to bear the relationship $V_{read} > V_{sg1} > V_{sg2}$, $V_{sg1} > V_{read} > V_{sg2}$, or $V_{sg1} > V_{sg2} > V_{read}$ in order to achieve a high speed reading of the nonvolatile semiconductor memory device.

<Third Embodiment>

Figure 7:
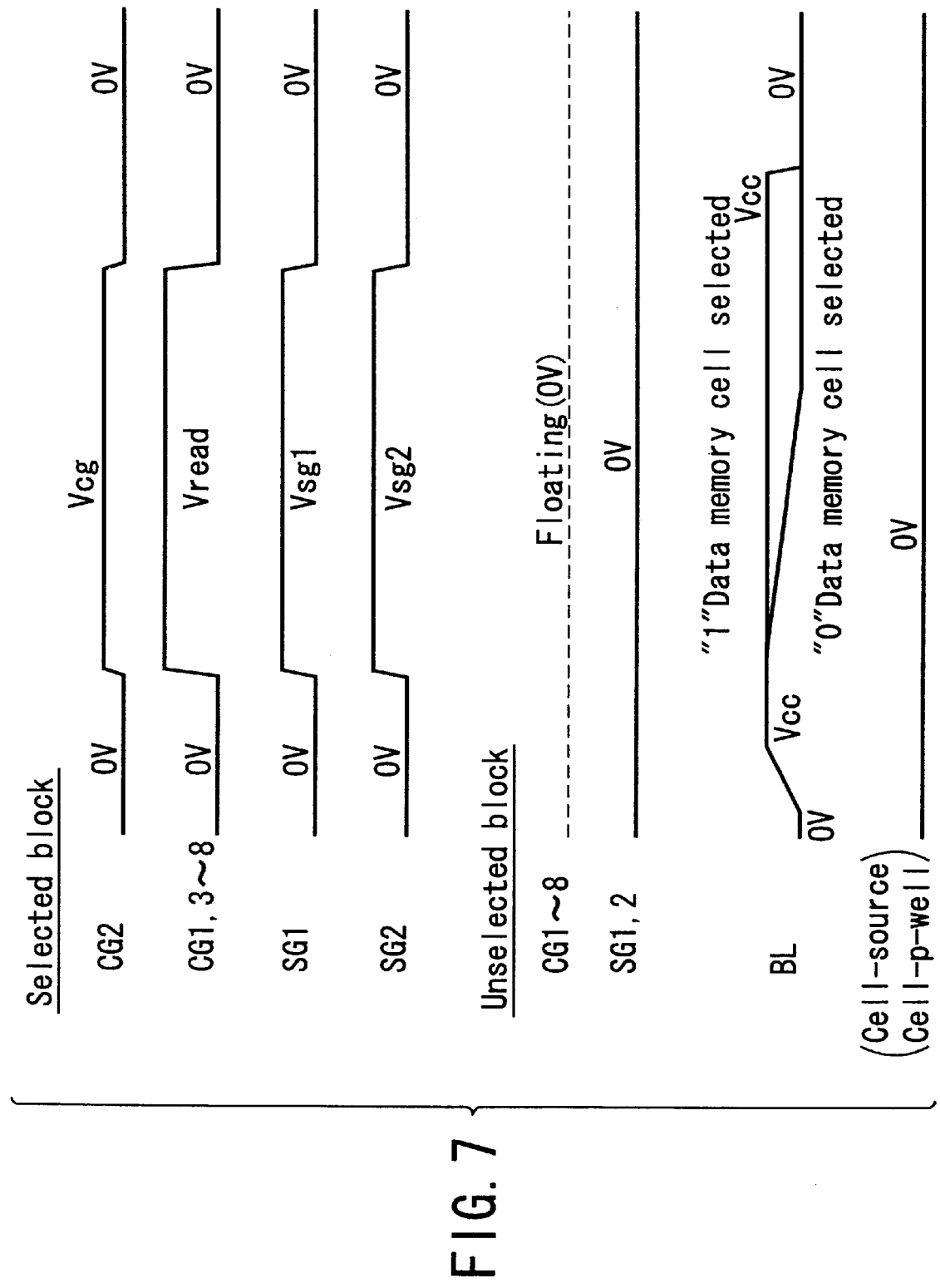
FIG. 7 is a timing wave form diagram showing the read operation of the nonvolatile semiconductor memory device according to a third embodiment of the present invention.

The read operation of the nonvolatile semiconductor memory device according to a third embodiment of the present invention will now be described with reference to FIG. 7. Specifically, FIG. 7 shows a timing wave form of the read operation in the third embodiment of the present invention. The read operation shown in FIG. 7 is featured in that the voltage Vcg of the control gate line CG2 of the selected memory cell is set positive. The voltage of the unselected control gate line in the selected block differs from the voltage of the select gate line in the third embodiment, too. In other words, the effect similar to that obtained in each of the first and second embodiments is obtained in the third embodiment by setting the condition $V_{read} \neq V_{sg1}$, $V_{read} \neq V_{sg2}$.

Figure 8:
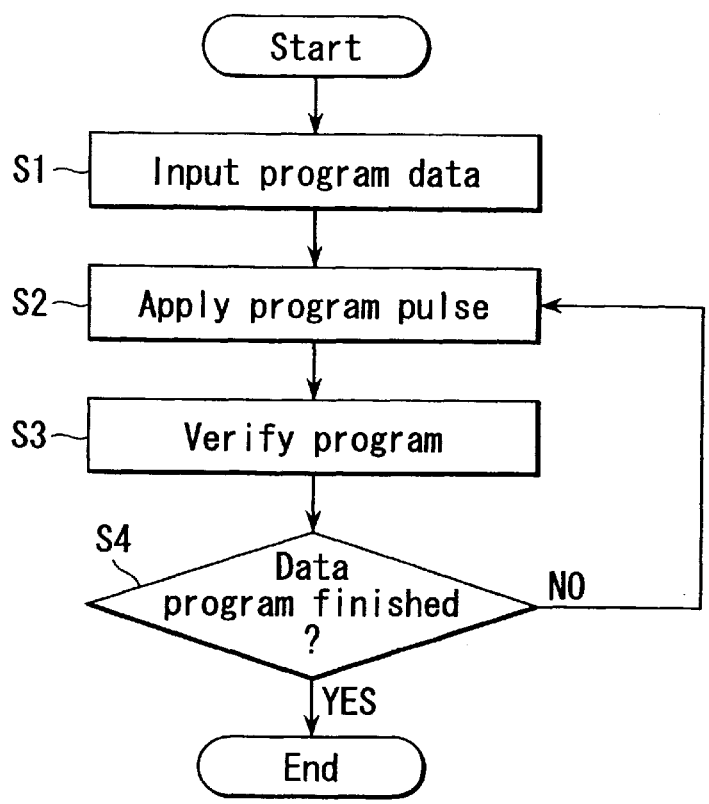
FIG. 8 is a flow diagram showing the data program operation.

As shown in FIG. 7, the program verify read operation is an example of the case where the voltage of the selected control gate line is positive. FIG. 8 is a flow chart showing the data program operation.

If the program operation is started, the program data is inputted from outside the chip in step S1. Then, a high voltage (about 20V) for the programming is applied to the selected control gate line by the program pulse applying operation performed in step S2, followed by performing the program verify read operation in step S3.

In this case, it is desirable to set the threshold voltage level of the memory cell set at a positive threshold voltage by the data program ("1" data program) at a voltage level sufficiently higher than 0V in order to increase the read margin. Therefore, the selected control gate line is set at a high voltage level higher than the control gate line voltage in the ordinary read operation.

For example, if the voltage level of the selected control gate line is 0V in the ordinary read operation, the voltage level of the selected control gate line in the program verify read operation is set at a positive voltage having the voltage wave form shown as the voltage $V_{cg}$ of the selected gate line CG2 in the uppermost stage of FIG. 7.

The read operation in a multi-level memory, in which data greater than 1 bit is stored in a single memory by setting three or more threshold voltage levels in a single memory cell, constitutes another example of the case where the voltage of the selected control gate line is positive.

Figure 9:
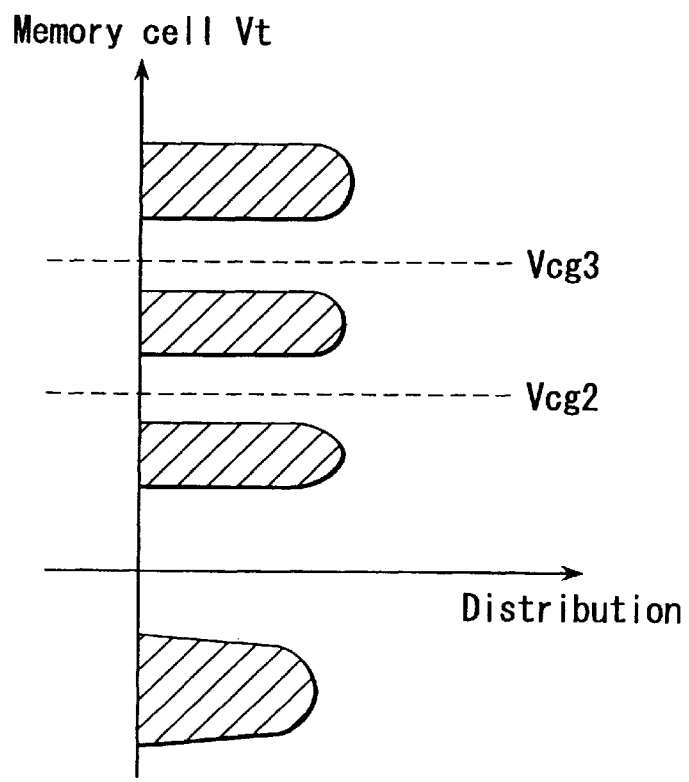
FIG. 9 shows the threshold voltage distribution of a memory cell storing two bits/cell.

FIG. 9 shows the threshold voltage distribution $V_t$ of the memory cell, covering the case where data of two bits is stored in a single memory cell by setting four threshold voltage levels in a single memory cell. As shown by broken lines in FIG. 9, in reading the threshold voltage of the memory cell of the multi-level memory, it is necessary to apply a positive voltage such as $V_{cg2}$ or $V_{cg3}$ in addition to 0V as a selected control gate line voltage. In this case, $V_{cg}$ is rendered positive in the timing wave form of the read operation shown in FIG. 7. Incidentally, $V_{cg}$ represents $V_{cg2}$, $V_{cg3}$ etc. in the general form.

It is not absolutely necessary to set the voltage of the selected control gate line at 0V in the ordinary data read operation, too. It is possible for the voltage of the selected control gate line at 1V or 2V. For example, it is possible to set the boundary level of the memory state between the "0" data and the "1" data at 1V or 2V. In this case, it is possible to employ the read operation described in the third embodiment of the present invention.

Described in each of the first to third embodiments of the present invention is the relationship in magnitude between the unselected control gate line voltage and the selected select gate line voltage in the data read operation. However, the particular relationship is not necessarily limited to those described in the first to third embodiments of the present invention.

For example, it is possible to increase the read operation by setting the condition of $V_{read} < V_{sg1}$ or $V_{read} < V_{sg2}$ in each of the first and third embodiments of the present invention. An example in which the particular method is effective includes the case where the resistance of the select transistor is higher than the resistance of 8 memory cells in the data read operation in the NAND cell including the selected memory cell having the "0" data stored therein. In this case, as a method of increasing the current flowing through the NAND cell, it is effective to set the voltage of the select gate at a high value.

If the voltage of the control gate line is rendered excessively high in the case of making the voltage of the control gate line equal to the voltage of the select gate line, electrons are injected from the channel of the memory cell into the floating gate so as to make it possible for the data stored in the memory cell to be broken. In this case, it is an effective method of preventing the breakage of the stored data to increase the voltage of the select gate line alone while maintaining the voltage of the unselected control gate line at $V_{read}$. In this case, it is possible to increase the read operation by setting the condition of $V_{read} < V_{sg1}$ or $V_{read} < V_{sg2}$. This method is particularly effective in the case where the reliability relative to the voltage application between the gate and the channel of the select transistor is high.

In each of the first to third embodiments of the present invention described above, 8 memory cells are connected in series to a single NAND cell. However, the number of memory cells connected in series is not limited to 8. The first to third embodiments are similarly effective in the case where, for example, 2, 4, 16, 32, or 64 memory cells are connected in series. The first to third embodiments are similarly effective in the case where a single memory cell is connected between the select transistors S1 and S2 in the NAND cell.

<Fourth Embodiment>

A fourth embodiment of the present invention will now be described with reference to FIG. 10. In the fourth embodiment of the present invention, the read operation of the NAND type EEPROM described in each of the first and third embodiments is applied to the DINOR type EEPROM. Incidentally, the DINOR type EEPROM is described in detail in, for example, "IEDM Tech. Digest, 1992, pp. 599–602".

Figure 10:
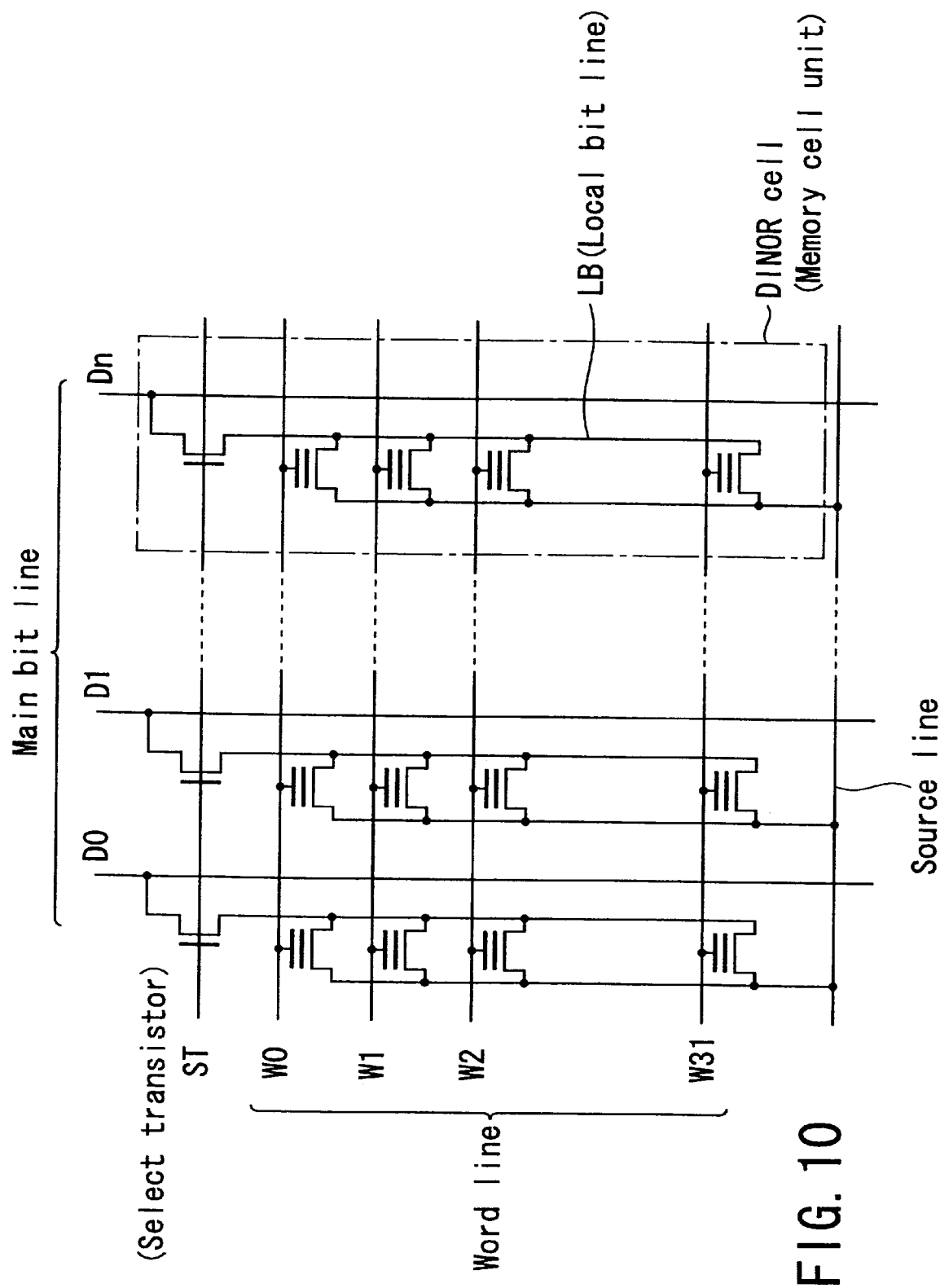
FIG. 10 is an equivalent circuit diagram of a memory cell array included in a DINOR type EEPROM.

FIG. 10 shows the construction of the memory cell array of the DINOR type EEPROM. As shown in the drawing, main bit lines D0 to Dn are arranged in the column direction of the memory cell array, and local bit lines LB are connected to each main bit line through a select transistor. The local bit lines are arranged in the column direction along the main bit lines.

Source lines are drawn in parallel to each of the local bit lines from the common source line arranged in the column direction of the memory cell array, and a plurality of memory cells are connected in parallel between each local bit line and the source line so as to form a memory cell unit consisting of DINOR cells.

The select gate of a select transistor is connected to a select gate line ST arranged in the row direction for each cell block consisting of a plurality of memory cell units, and the control gate of the memory cell is connected to, for example, 32 word lines WL0 to WL31 arranged in the column direction for each cell block consisting of a plurality of memory cell units.

In the DINOR type EEPROM shown in FIG. 10, the memory cell unit is selected by the main bit lines D0 to Dn and the select gate line ST, and the memory cells constituting the memory cell unit are selected by using word lines WL0 to WL31. In the read operation of the DINOR type EEPROM, a low level voltage for turning off the unselected memory cell is applied to the unselected word lines, and the read voltage $V_{read}$ is applied to the selected word line so as to detect the data program state of the selected memory cell.

The pre-charge voltage Vcc is imparted to the main bit line so as to detect the program state of the select memory cell from the change in voltage of the main bit line caused by the discharge current flowing from the main bit line into the common source line through the select transistor of the local bit line and the selected memory cell.

In this case, the relationship between the voltage $V_{st}$ of the select gate line ST required for realizing a high speed reading and the read voltage $V_{read}$ of the selected word line can be derived similarly by using the relationship between the voltage $V_{sg1}$ of the selected gate line SG1 and the read voltage $V_{read}$ of the unselected control gate line described previously in conjunction with the first and third embodiments of the present invention.

<Fifth Embodiment>

A fifth embodiment of the present invention will now be described with reference to FIG. 11. In the fifth embodiment of the present invention, the read operation of the NAND type EEPROM described previously in conjunction with the first to third embodiments of the present invention is applied to the AND type EEPROM. The AND type EEPROM is described in detail in, for example, "IEDM Tech. Digest, 1992, pp. 991–993".

Figure 11:
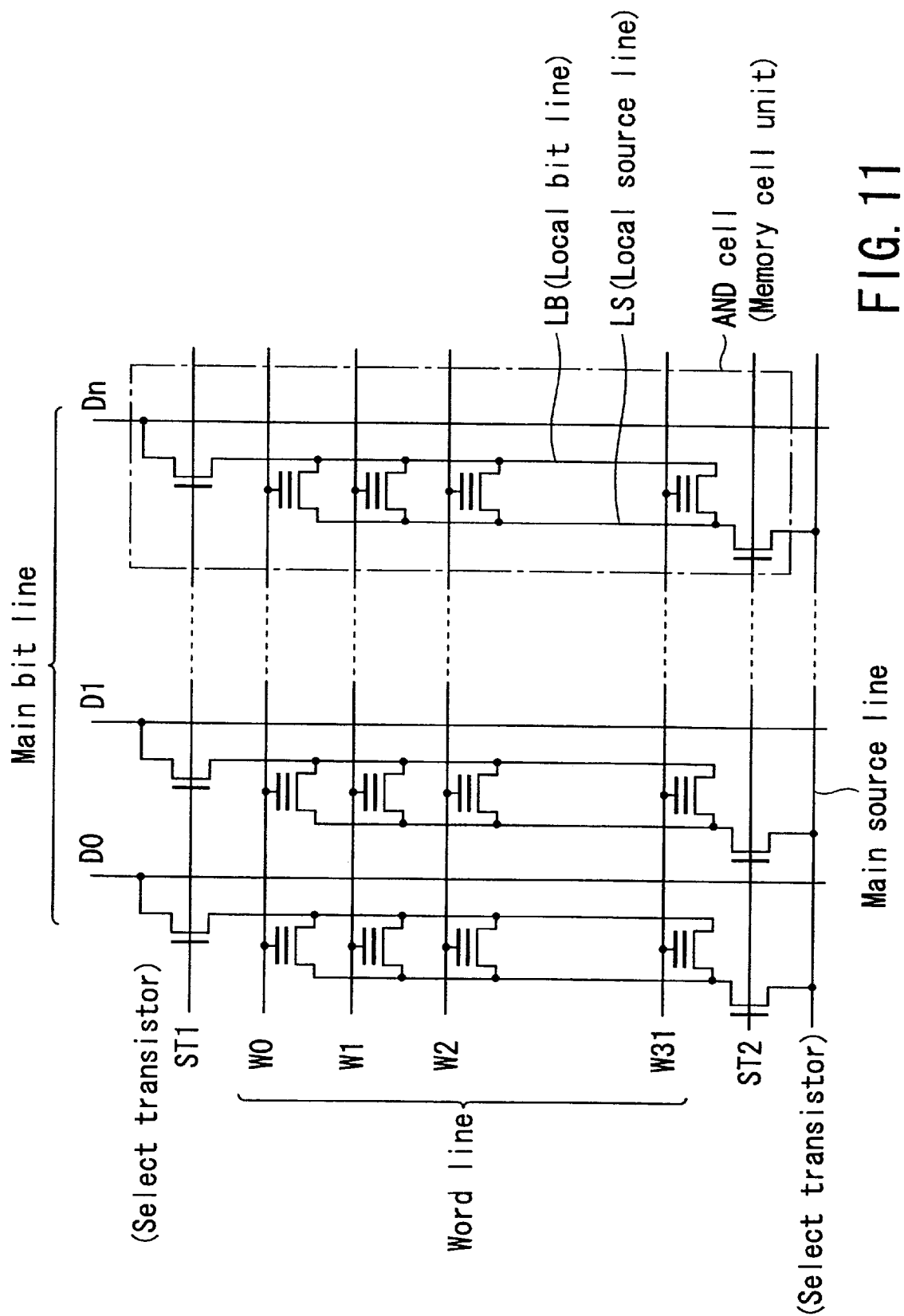
FIG. 11 is an equivalent circuit diagram of a memory cell array included in an AND type EEPROM.

The read operation of the memory cell array in the AND type EEPROM shown in FIG. 11 is equal to that of the memory cell array of the DINOR type EEPROM described previously with reference to FIG. 10, except that, in the memory cell array in the AND type EEPROM shown in FIG. 11, a second select transistor is connected between the local source line and the main source line. Under the circumstances, the differences between the read operation of the memory cell array in the AND type EEPROM shown in FIG. 11 and the read operation of the memory cell array in the DINOR type EEPROM shown in FIG. 10 will now be described.

In the read operation of the AND type EEPROM, the memory cell unit is selected by the main bit lines D0 to Dn and the select gate lines ST1, ST2, and a pre-charge voltage Vcc is imparted to the main bit line so as to detect the program state from the change in the voltage of the main bit line caused by the discharge current flowing from the main bit line into the main source line through the first select transistor connected between the main bit line and the local bit line, the selected memory cell connected between the local bit line and the local source line, and the second select transistor connected between the local source line and the common source line.

In this case, the relationship among the voltage $V_{st1}$ of the selected gate line ST1 of the first select transistor, the voltage $V_{st2}$ of the selected gate line ST2 of the second select transistor, and the read voltage $V_{read}$ of the selected word line required for realizing a high speed reading can be applied similarly by using the relationship among the voltage $V_{sg1}$ of the select gate line SG1, the voltage $V_{sg2}$ of the select gate line SG2, and the read voltage $V_{read}$ of the unselected control gate line in the NAND type EEPROM described previously in conjunction with the first to third embodiments of the present invention.

<Sixth Embodiment>

A sixth embodiment of the present invention will now be described with reference to FIGS. 12 and 13. In the sixth embodiment of the present invention, the read operation of the NAND type EEPROM described previously in conjunction with the first to third embodiments of the present invention is applied to a NOR type EEPROM.

Figure 12:
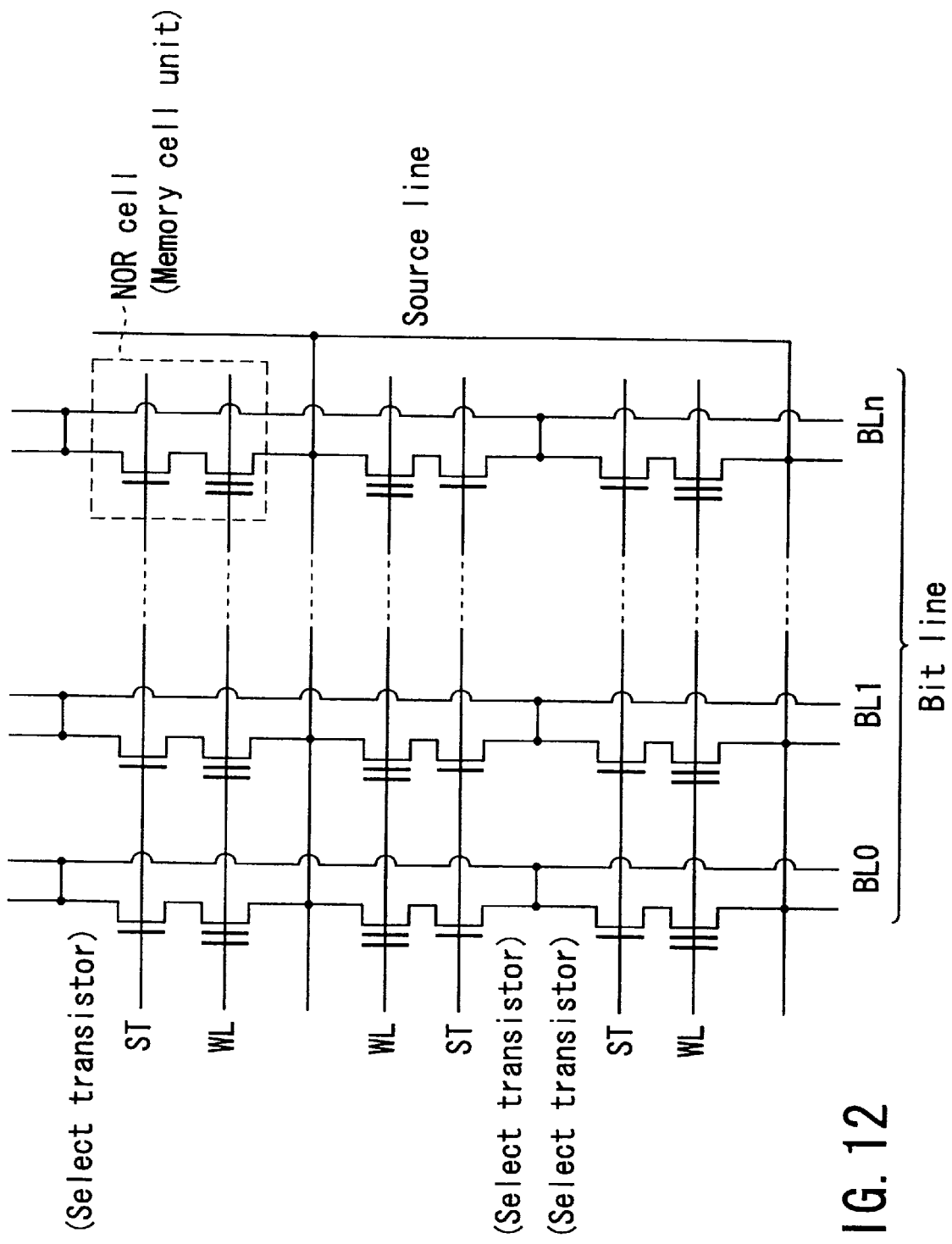
FIG. 12 is an equivalent circuit diagram of a memory cell array included in an NOR type EEPROM.

FIG. 12 shows the construction of the memory cell array of the NOR type EEPROM. As shown in the drawing, bit lines BL0 to BLn are arranged in the column direction of the memory cell array, and a common source line is arranged in the column direction of the memory cell array. A plurality of source lines are drawn from the common source line in the row direction of the memory cell array, and a memory cell unit consisting of a NOR type cell, in which a single select transistor on the side of the bit line is connected in series to a single memory cell on the side of the source line, is connected between each bit line and each source line.

The select gate of the select transistor is connected to the select gate line ST arranged in the row direction for each block consisting of a plurality of memory cell units, and the control gate of the memory cell is connected to the word line WL arranged in the row direction for each block consisting of a plurality of memory cell units.

In the NOR type EEPROM shown in FIG. 12, the memory cell unit connected in parallel between each bit line and the source line is selected by the bit lines BL0 to BLn and the select gate line ST, and the memory cell constituting the memory cell unit is selected by using the word line WL. In the read operation of the NOR type EEPROM, a low level voltage turning off the unselected memory cell is applied to the unselected word line, and the read voltage $V_{read}$ is imparted to the selected word line, so as to detect the data program state of the selected memory cell.

If a pre-charge voltage Vcc is imparted to the bit line, the program state is detected from the change in voltage of the bit line caused by the discharge current flowing from the main bit line into the common source line through the select transistor on the side of the bit line and the selected memory cell on the side of the source line. In this case, the relationship between the voltage $V_{st}$ of the select gate line ST required for realizing a high speed reading and the read voltage $V_{read}$ of the selected word line can be similarly applied by using the relationship between the voltage $V_{sg1}$ of the select gate line SG1 and the read voltage $V_{read}$ of the unselected control gate line in the NAND type EEPROM described previously in conjunction with the first and third embodiments of the present invention.

Figure 13:
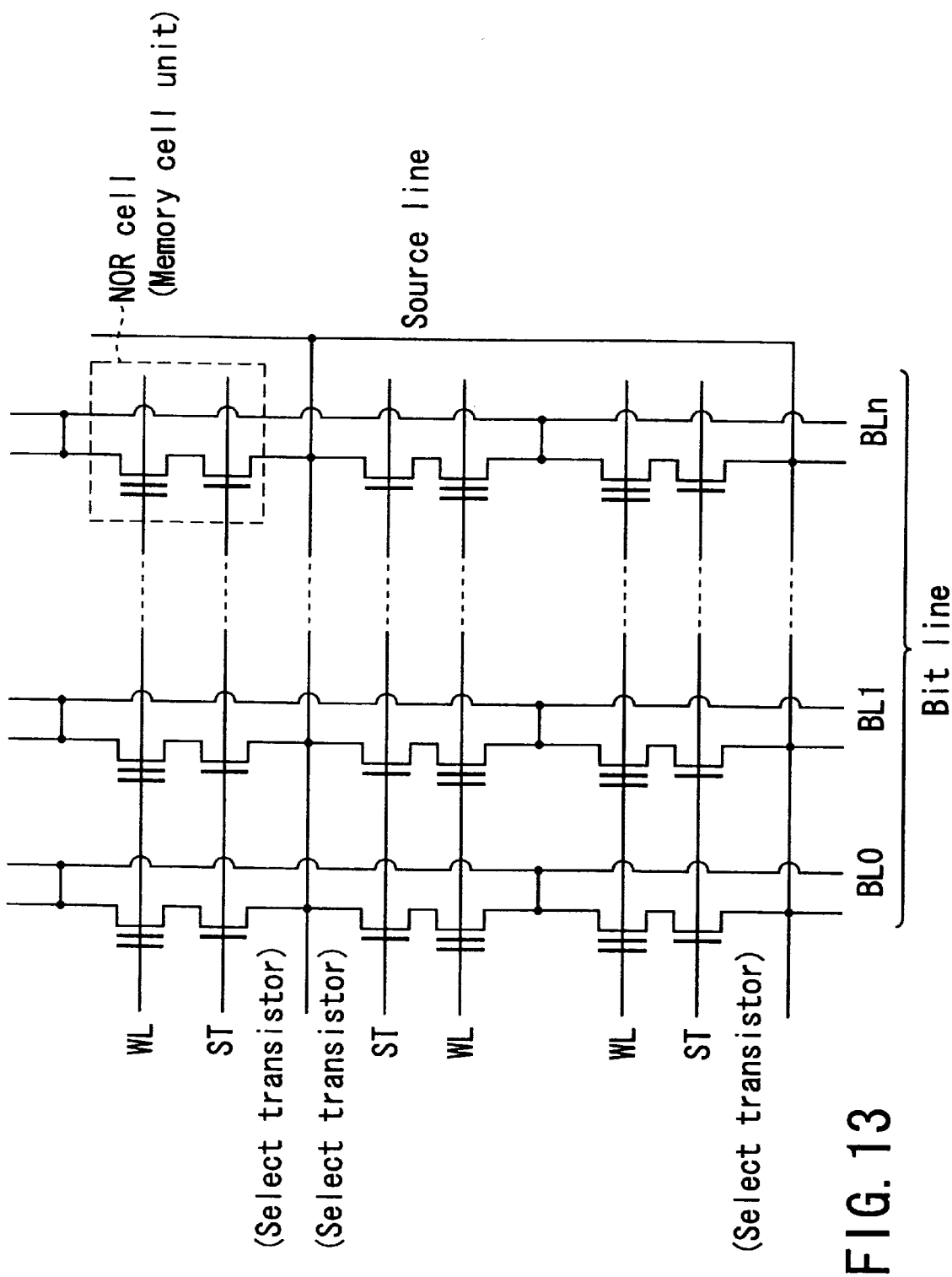
FIG. 13 is an equivalent circuit diagram of a memory cell array included in another NOR type EEPROM.

The NOR type EEPROM shown in FIG. 13 is featured in that the memory cell unit consists of the select transistor connected on the side of the source line and the memory cell connected on the side of the bit line, and is equal to the NOR type EEPROM shown in FIG. 12 in the other construction and the read operation. Therefore, the explanation of the overlapping portion is omitted in the following description.

In the NOR type EEPROM shown in FIG. 13, the relationship between the voltage $V_{st}$ of the select gate line ST required for realizing a high speed reading and the read voltage $V_{read}$ of the selected word line can be similarly applied by using the relationship between the voltage $V_{sg2}$ of the select gate line SG2 and the read voltage $V_{read}$ of the unselected control gate line in the NAND type EEPROM described previously in conjunction with the first and third embodiments of the present invention.

The present invention is not limited to the embodiments described above. As described previously, the technical idea of the present invention can also be applied similarly to the case where a single memory cell is connected between the select transistor S1 on the side of the bit line and the select transistor S2 on the side of the source line in the read operation of the NAND type EEPROM described in conjunction with each of the first and third embodiments of the present invention. In this case, however, the relationship among the voltages $V_{sg1}$, $V_{sg2}$ of the select gate lines SG1, SG2, and the read voltage $V_{read}$ of the selected memory cell required for realizing a high speed reading is applied by using the relationship among the voltages $V_{sg1}$, $V_{sg2}$ of the select gate lines SG1, SG2, and the read voltage $V_{read}$ of the selected memory cell described previously in conjunction with the fourth to sixth embodiments of the present invention. Further, the present invention can be worked in variously modified fashions within the technical scope of the present invention.

As described above, the present invention provides a nonvolatile semiconductor memory device capable of achieving a high speed data reading while avoiding the breakdown of the insulating film formed between the select gate and the channel of the select transistor.

What is claimed is:

1. A nonvolatile semiconductor memory device, comprising:
    a memory cell array including memory cell units each comprising at least one select transistor and at least one memory cell and arranged to form an array;
    a control gate line including control gates of memory cells connected continuously in a row direction of the memory cell array; and
    a select gate line including select gates of select transistors connected continuously in said row direction of said memory cell array;
    wherein the highest value of a first voltage level of said control gate line in a selected memory cell unit differs from a second voltage level of all said select gate lines of said memory cell unit during a read operation of a program data programmed in said memory cell and during a verify read operation of said program data.

2. The nonvolatile semiconductor memory device according to claim 1, wherein:
    said memory cell unit comprises a memory cell column in which the adjacent plural memory cells are connected in series, a first select transistor connected to one terminal section of said memory cell column, and a second select transistor connected to the other terminal section of said memory cell column;
    a first insulating film interposed between a first channel of said first select transistor and a first select gate of said first select transistor and a second insulating film interposed between a second channel of said second select transistor and a second select gate of said second select transistor are formed in the same step; and
    a first ion implantation into said first and second channels of said first and second select transistors is performed in the same step.

3. The nonvolatile semiconductor memory device according to claim 2, wherein said first ion implantation into said first and second channels of said first and second select transistors and a second ion implantation into a third channel of said memory cell are performed in the same step.

4. The nonvolatile semiconductor memory device according to claim 1, wherein said first voltage level of an unselected control gate line included in said selected memory cell unit is set higher than said second voltage level of all said select gate lines included in said memory cell unit in performing said read operation of said program data programmed in said memory cell and in performing said verify read operation of said program data.

5. The nonvolatile semiconductor memory device according to claim 4, wherein:
    said memory cell unit comprises a memory cell column in which the adjacent plural memory cells are connected in series, a first select transistor connected to one terminal section of said memory cell column, and a second select transistor connected to the other terminal section of said memory cell column;
    a first insulating film interposed between a first channel of said first select transistor and a first select gate of said first select transistor and a second insulating film interposed between a second channel of said second select transistor and a second select gate of said second select transistor are formed in the same step; and
    a first ion implantation into said first and second channels of said first and second select transistors is performed in the same step.

6. The nonvolatile semiconductor memory device according to claim 5, wherein said first ion implantation into said first and second channels of said first and second select transistors and a second ion implantation into a third channel of said memory cell are performed in the same step.

7. The nonvolatile semiconductor memory device according to claim 1, wherein:
    said memory cell has a laminate gate structure comprising a floating gate configured to store the data by an accumulation state of charge and said control gate configured to control said accumulation state of charge in said floating gate;
    said select gate of said select transistor and said floating gate are formed in the same wiring layer; and
    the thickness of a first insulating film interposed between a first channel of said memory cell and said floating gate is equal to the thickness of a second insulating film interposed between a second channel of said select transistor and said select gate of said select transistor.

8. The nonvolatile semiconductor memory device according to claim 7, wherein:
    said memory cell unit comprises a memory cell column in which the adjacent plural memory cells are connected in series, a first select transistor connected to one terminal section of said memory cell column, and a second select transistor connected to the other terminal section of said memory cell column;
    a third insulating film interposed between a third channel of said first select transistor and a first select gate of said first select transistor and a fourth insulating film interposed between a fourth channel of said second select transistor and a second select gate of said second select transistor are formed in the same step; and a first ion implantation into said third and fourth channels of the first and second select transistors is performed in the same step.

9. The nonvolatile semiconductor memory device according to claim 8, wherein said first ion implantation into said third and fourth channels of said first and second select transistors and a second ion implantation into said first channel of said memory cell are performed in the same step.

10. The nonvolatile semiconductor memory device according to claim 1, wherein a first insulating film interposed between a first channel of said memory cell and said floating gate of said memory cell and a second insulating film interposed between a second channel of said select transistor and said select gate of said select transistor are formed in the same step.

11. The nonvolatile semiconductor memory device according to claim 10, wherein:

said memory cell unit comprises a memory cell column in which the adjacent plural memory cells are connected in series, a first select transistor connected to one terminal section of said memory cell column, and a second select transistor connected to the other terminal section of said memory cell column;

a third insulating film interposed between a third channel of said first select transistor and a first select gate of said first select transistor and a fourth insulating film interposed between a fourth channel of said second select transistor and a second select gate of said second select transistor are formed in the same step; and a first ion implantation into said third and fourth channels of said first and second select transistors is performed in the same step.

12. The nonvolatile semiconductor memory device according to claim 11, wherein said first ion implantation into said third and fourth channels of said first and second select transistors and a second ion implantation into said first channel of said memory cell are performed in the same step.

13. A nonvolatile semiconductor memory device, comprising:

a memory cell array including memory cell units each comprising first and second select transistors and at least one memory cell and arranged to form an array;

a control gate line including control gates of memory cells connected continuously in a row direction of the memory cell array;

a first select gate line including select gates of said first select transistors connected continuously in said row direction of said memory cell array; and a second select gate line including select gates of said second select transistors connected continuously in said row direction of said memory cell array;

wherein a first voltage level of said first select gate line in the selected memory cell unit differs from a second voltage level of said second select gate line in said memory cell units during a read operation of a program data programmed in said memory cell and during a verify read operation of said program data.

14. The nonvolatile semiconductor memory device according to claim 13, wherein:

said memory cell unit comprises a memory cell column in which the adjacent plural memory cells are connected in series or in parallel, a first select transistor connected to one terminal section of said memory cell column, and a second select transistor connected to the other terminal section of said memory cell column;

a first insulating film interposed between a first channel of said first select transistor and a first select gate of said first select transistor and a second insulating film interposed between a second channel of said second select transistor and a second select gate of said second select transistor are formed in the same step; and a first ion implantation into said first and second channels of said first and second select transistors is performed in the same step.

15. The nonvolatile semiconductor memory device according to claim 14, wherein said first ion implantation into said first and second channels of said first and second select transistors and a second ion implantation into a third channel of said memory cell are performed in the same step.

16. The nonvolatile semiconductor memory device according to claim 13, wherein said first voltage level of an unselected control gate line included in said selected memory cell unit is set higher than said second voltage level of all of said first and second select gate lines in performing said read operation of said program data programmed in said memory cell and in performing said verify read operation of said program data.

17. The nonvolatile semiconductor memory device according to claim 16, wherein:

said memory cell unit comprises a memory cell column in which the adjacent plural memory cells are connected in series or in parallel, a first select transistor connected to one terminal section of said memory cell column, and a second select transistor connected to the other terminal section of said memory cell column;

a first insulating film interposed between a first channel of said first select transistor and a first select gate of said first select transistor and a second insulating film interposed between a second channel of said second select transistor and a second select gate of said second select transistor are formed in the same step; and a first ion implantation into said first and second channels of the first and second select transistors is performed in the same step.

18. The nonvolatile semiconductor memory device according to claim 17, wherein said first ion implantation into said first and second channels of said first and second select transistors and a second ion implantation into a third channel of said memory cell are performed in the same step.

19. The nonvolatile semiconductor memory device according to claim 13, wherein:

said memory cell has a laminate gate structure comprising a floating gate configured to store the data by the accumulation state of charge and said control gate configured to control said accumulation state of the charge in said floating gate;

select gates of said first and second select transistors and said floating gate are formed in the same wiring layer; and the thickness of a first insulating film interposed between a first channel of said memory cell and said floating gate is equal to the thickness of each of a second insulating films interposed between a second channels of said first and second select transistors and said select gates of said first and second select transistors.

20. The nonvolatile semiconductor memory device according to claim 19, wherein:

said memory cell unit comprises a memory cell column in which the adjacent plural memory cells are connected in series or in parallel, a first select transistor connected to one terminal section of said memory cell column, and a second select transistor connected to the other terminal section of said memory cell column;

a third insulating film interposed between a third channel of said first select transistor and a first select gate of said first select transistor and a fourth insulating film interposed between a fourth channel of said second select transistor and a second select gate of said second select transistor are formed in the same step; and a first ion implantation into the channels of the first and second select transistors is performed in the same step.

21. The nonvolatile semiconductor memory device according to claim 20, wherein a first ion implantation into said third and fourth channels of said first and second select transistors and said ion implantation into said first channel of said memory cell are performed in the same step.

22. The nonvolatile semiconductor memory device according to claim 13, wherein a first insulating film interposed between a first channel of said memory cell and said floating gate of said memory cell and each of a second insulating films interposed between a second channels of said first and second select transistors and said select gates of said first and second select transistors are formed in the same step.

23. The nonvolatile semiconductor memory device according to claim 22, wherein:

said memory cell unit comprises a memory cell column in which the adjacent plural memory cells are connected in series or in parallel, a first select transistor connected to one terminal section of said memory cell column, and a second select transistor connected to the other terminal section of said memory cell column;

a third insulating film interposed between a third channel of said first select transistor and a first select gate of said first select transistor and a fourth insulating film interposed between a fourth channel of said second select transistor and a second select gate of said second select transistor are formed in the same step; and a first ion implantation into said third and fourth channels of said first and second select transistors is performed in the same step.

24. The nonvolatile semiconductor memory device according to claim 23, wherein said first ion implantation into said third and fourth channels of said first and second select transistors and a second ion implantation into said first channel of said memory cell are performed in the same step.

* * * * *